US007030034B2

(12) United States Patent
Fucsko et al.

(10) Patent No.: US 7,030,034 B2
(45) Date of Patent: Apr. 18, 2006

(54) METHODS OF ETCHING SILICON NITRIDE SUBSTANTIALLY SELECTIVELY RELATIVE TO AN OXIDE OF ALUMINUM

(75) Inventors: Janos Fucsko, Boise, ID (US); Grady S. Waldo, Boise, ID (US); Kevin J. Torek, Meridian, ID (US); Li Li, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 235 days.

(21) Appl. No.: 10/664,738

(22) Filed: Sep. 18, 2003

(65) Prior Publication Data

US 2005/0061768 A1 Mar. 24, 2005

(51) Int. Cl.
*H01L 21/302* (2006.01)

(52) U.S. Cl. ...................... 438/757; 438/745; 438/747; 438/749; 438/750

(58) Field of Classification Search ................ 438/745, 438/747, 749, 750, 757
See application file for complete search history.

(56) References Cited

U.S. PATENT DOCUMENTS

| | | | | |
|---|---|---|---|---|
| 4,087,367 A * | 5/1978 | Rioult et al. | ............... | 252/79.1 |
| 4,269,654 A * | 5/1981 | Deckert et al. | ............. | 438/756 |
| 4,959,103 A * | 9/1990 | Siegl et al. | .............. | 106/14.16 |
| 5,965,465 A * | 10/1999 | Rath et al. | .................. | 438/745 |
| 5,976,988 A * | 11/1999 | Konuma et al. | ............ | 438/745 |
| 6,589,439 B1 * | 7/2003 | Honda et al. | ............... | 216/107 |
| 2002/0087035 A1 * | 7/2002 | Cortright et al. | ........... | 568/864 |

FOREIGN PATENT DOCUMENTS

GB 1160945 * 8/1969

OTHER PUBLICATIONS

Protasov, Thermo-optical Characteristics of Refractory Dielectric materials in a Field of High Intensity Radiation, Dielectric Materials, Measurements and Applications Conference publication No. 473, copyright IEEE 2000.*
Plastics Design Library Staff, Chemical Resistance of Plastics and Elastomers (3rd Edition), William Andrew Publishing/Plastics Design Library, copyright 2001, ISBN-884207-90-1, 3000 pages, Released Mar. 25, 2002.*
Protasov et al.; Thermo-optical Characteristics of Refractory Dielectric materials in a Field of High Intensity Radiation, Dielectric Materials, Measurements and Applications Conference publication No. 473, copyright IEEE 2000.*
Deckert, *Pattern Etching of CVD $Si_3N_4/SiO_2$ Composities in HF/Glycerol Mixtures*, 127 J. Electrochem. Soc., No. 11, pp. 2433-2438 (Nov. 1980).

(Continued)

*Primary Examiner*—Nadine G. Norton
*Assistant Examiner*—Patricia George
(74) *Attorney, Agent, or Firm*—Wells St. John P.S.

(57) ABSTRACT

A method of etching silicon nitride substantially selectively relative to an oxide of aluminum includes providing a substrate comprising silicon nitride and an oxide of aluminum. The silicon nitride and the oxide is exposed to an etching solution comprising HF and an organic HF solvent under conditions effective to etch the silicon nitride substantially selectively relative to the oxide. Other aspects and implementations are contemplated.

53 Claims, 3 Drawing Sheets

OTHER PUBLICATIONS

B. Garrido et al., "The Role of Chemical Species in the Passivation of <100> Silicon Surfaces by HF in Water-Ethanol Solutions", J. Electrochem. Soc., vol. 143, No. 12, Dec. 1996, pp. 4059-4066.

Wood et al., "Etching Silicon Nitride and Silicon Oxide Using Ethylene Glycol / Hydrofluoric Acid Mixtures", Electrochemical Society Proceedings vol. 99-36, pp. 258-263.

Knotter et al., "Etching Mechanism of Silicon Nitride in HF-Based Solutions", J. Electrochem. Soc., 148 (3), 2001, pp. F43-F46.

T. Kezuka et al., "The Control of Etching Rate for Various $SiO_2$ Films", Electrochemical Society Proceedings, vol. 99-36, 2000, pp. 244-251.

* cited by examiner

METHODS OF ETCHING SILICON NITRIDE SUBSTANTIALLY SELECTIVELY RELATIVE TO AN OXIDE OF ALUMINUM

TECHNICAL FIELD

The invention is related to methods of etching silicon nitride substantially selectively relative to an oxide of aluminum, and to methods of forming trench isolation within a semiconductor substrate.

BACKGROUND OF THE INVENTION

Integrated circuitry is typically fabricated on and within semiconductor substrates, for example relative to bulk semiconductor substrates and in semiconductor-on-insulator substrates. One exemplary technique for isolating different areas of circuitry includes the fabrication of trench isolation within the substrate, for example a bulk monocrystalline silicon substrate. For example, trenches are etched within a bulk semiconductor substrate and thereafter filled with an insulating silicon dioxide material.

The trenches might be lined with one or more insulative materials in addition to a primary or bulk insulative and/or semiconductive material(s). For example, isolation trenches might be lined with a thermal silicon dioxide layer grown from sidewalls of the trenches where such comprise silicon. A thin silicon nitride layer might be deposited thereover as a stress buffer and/or diffusion barrier layer. The thermally grown silicon dioxide might also be formed considerably later in the process, or might be eliminated. Regardless, it is typically desirable to leave some of the isolation material formed within the trenches to be projecting from the semiconductor substrate material at the conclusion of the processing. This typically results from an etch of silicon nitride which is typically received over the semiconductor substrate adjacent isolation material projecting from the respective trenches.

The invention was directed to overcoming problems and issues as described above, although such is in no way so limited. The invention is only limited by the accompanying claims as literally worded, without interpretative or limiting reference to the specification, and in accordance with the doctrine of equivalents.

SUMMARY OF THE INVENTION

The invention includes methods of etching silicon nitride substantially selectively relative to an oxide of aluminum, and methods of forming trench isolation within a semiconductor substrate. In one implementation, a method of etching silicon nitride substantially selectively relative to an oxide of aluminum includes providing a substrate comprising silicon nitride and an oxide of aluminum. The silicon nitride and the oxide are exposed to an etching solution comprising HF and an organic HF solvent under conditions effective to etch the silicon nitride substantially selectively relative to the oxide.

In one implementation, a method of forming trench isolation within a semiconductor substrate includes forming a silicon nitride comprising layer over a semiconductor substrate. A series of isolation trenches are formed within the semiconductor substrate using a portion of the silicon nitride comprising layer as a mask. After etching the isolation trenches, an aluminum oxide comprising layer is deposited over tops and sidewalls of the silicon nitride comprising mask and to within the isolation trenches to less than fill the isolation trenches. After depositing the aluminum oxide, remaining volume of the trenches is filled with isolation material. Thereafter, the isolation material is removed effective to expose the silicon nitride comprising mask. After such exposing, the silicon nitride comprising mask is etched with an etching solution comprising HF and an organic HF solvent under conditions effective to etch the silicon nitride comprising mask substantially selectively relative to the aluminum oxide and relative to the isolation material.

Other aspects and implementations are contemplated.

BRIEF DESCRIPTION OF THE DRAWINGS

Preferred embodiments of the invention are described below with reference to the following accompanying drawings.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

One potential insulative liner material for a trench is aluminum oxide, for example as a substitute for the silicon nitride trench liner referred to above. A common chemistry for etching silicon nitride adjacent the projecting trench isolation material is $H_3PO_4$. Unfortunately, it has been discovered that the $H_3PO_4$ etches aluminum oxide at a considerably faster rate than such etches the silicon nitride. This can result in recessing of the aluminum oxide to within the trenches below the outermost surface of the semiconductive material into which the trenches are etched, and which is typically undesirable.

The invention is described in a first preferred embodiment in connection with FIGS. 1–7 in a preferred implementation of forming trench isolation regions within a semiconductor substrate. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Figure 1:
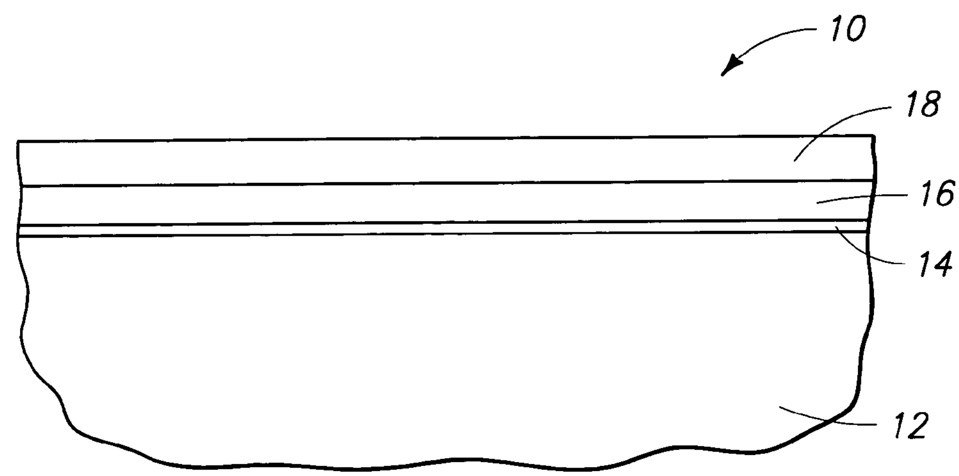
FIG. 1 is a diagrammatic sectional view of a semiconductor wafer fragment in process in accordance with an aspect of the invention.

FIG. 1 depicts a wafer fragment 10 comprised of a bulk monocrystalline silicon substrate 12. Other materials and substrates are of course contemplated, for example semiconductor-on-insulator substrates. A pad oxide layer 14 is formed thereover, and a silicon nitride comprising layer 16 is formed over substrate 14/12. An exemplary thickness range for layer 14 is from 50 Angstroms to 100 Angstroms, while an exemplary thickness range for layer 16 is from 400 Angstroms to 1200 Angstroms. A masking layer 18, for example photoresist, is formed over silicon nitride comprising layer 16. An exemplary thickness for layer 18 is from 2000 Angstroms to 8000 Angstroms.

Figure 2:
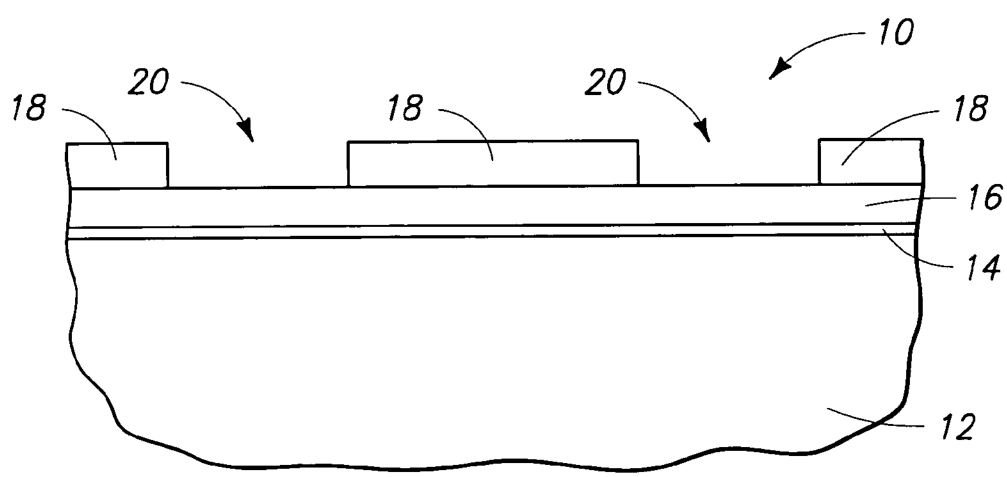
FIG. 2 is a view of the FIG. 1 wafer fragment at a processing step subsequent to that shown by FIG. 1.

Referring to FIG. 2, masking layer 18 has been patterned effective to form a plurality of trench mask openings 20 therethrough to silicon nitride comprising layer 16. Conventional photolithography or other lithographic or non-lithographic methods, whether existing or yet-to-be developed, and regardless of the presence of masking layer 18, are of course also contemplated.

Figure 3:
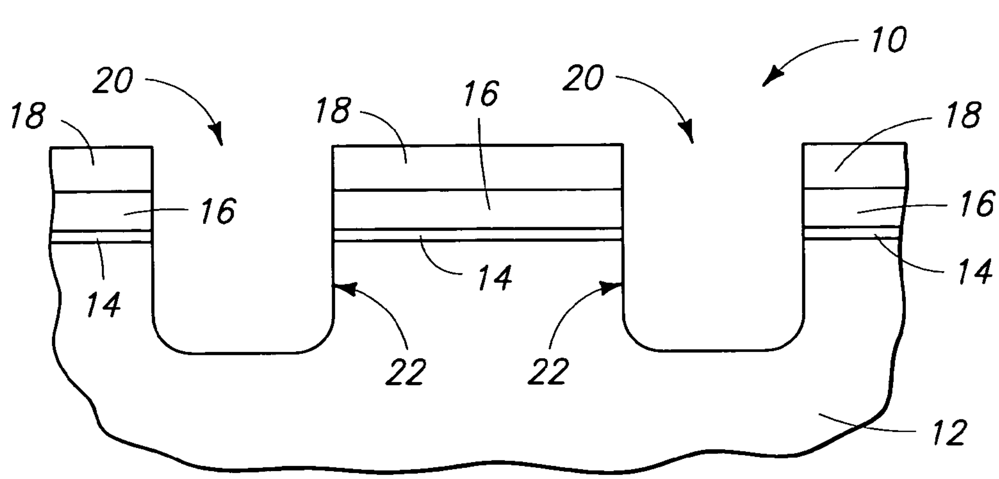
FIG. 3 is a view of the FIG. 2 wafer fragment at a processing step subsequent to that shown by FIG. 2.

Referring to FIG. 3, silicon nitride comprising layer 16, pad oxide layer 14, and substrate material 12 are etched through mask openings 20 effective to form the illustrated isolation trenches 22 within semiconductor substrate 10, including monocrystalline silicon substrate material 12 in the illustrated preferred embodiments. Such is preferably conducted utilizing a dry anisotropic etching chemistry, with or without plasma, for example comprising ammonia and at least one fluorocarbon. A common chemistry, or different chemistries, might be utilized for etching into/through the respective materials 16, 14 and 12. Masking layer 18 might remain or be removed when etching into substrate material 12.

Such provides but one example of etching a series of isolation trenches 22 within a semiconductor substrate 10. Any method of etching such trenches is contemplated, whether existing or yet-to-be developed, and regardless of the presence of layers 14, 16, 18 or other layers.

Figure 4:
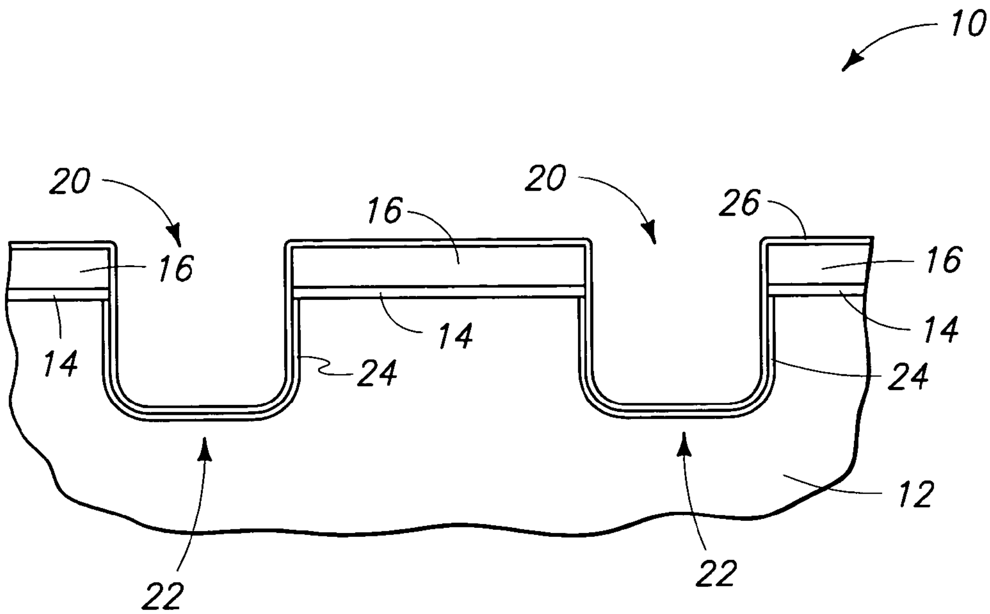
FIG. 4 is a view of the FIG. 3 wafer fragment at a processing step subsequent to that shown by FIG. 3.

Referring to FIG. 4, masking layer 18 has been removed and a thermal oxide layer 24 is grown within trenches 22. An aluminum oxide comprising layer 26 is deposited over ("on", as shown) the tops and sidewalls of the silicon nitride comprising mask 16 and to within isolation trenches 22 to less than fill such isolation trenches. Exemplary thicknesses for layers 24 and 26 are about 60 Angstroms each. Aluminum oxide comprising layer 26 might be deposited by any method, and might be deposited to be in an amorphous or crystalline form. Preferred techniques include any existing or yet-to-be developed manners, including for example chemical vapor deposition and plasma enhanced chemical vapor deposition. Regardless, deposited aluminum oxide layer 26 is preferably exposed to a temperature of at least 500° C. for at least 30 seconds after deposition to form a densified aluminum oxide. In the context of this document, "densified aluminum oxide" defines an aluminum oxide layer which has been exposed to a temperature of at least 500° C. for at least 30 seconds after its deposition, and either as a dedicated densification step or in conjunction with other processing of the wafer. A preferred manner of forming densified aluminum oxide is exposure in an inert atmosphere at ambient pressure to a temperature of from 500° C. to 1100° C. for anywhere from 30 seconds to 30 minutes.

Figure 5:
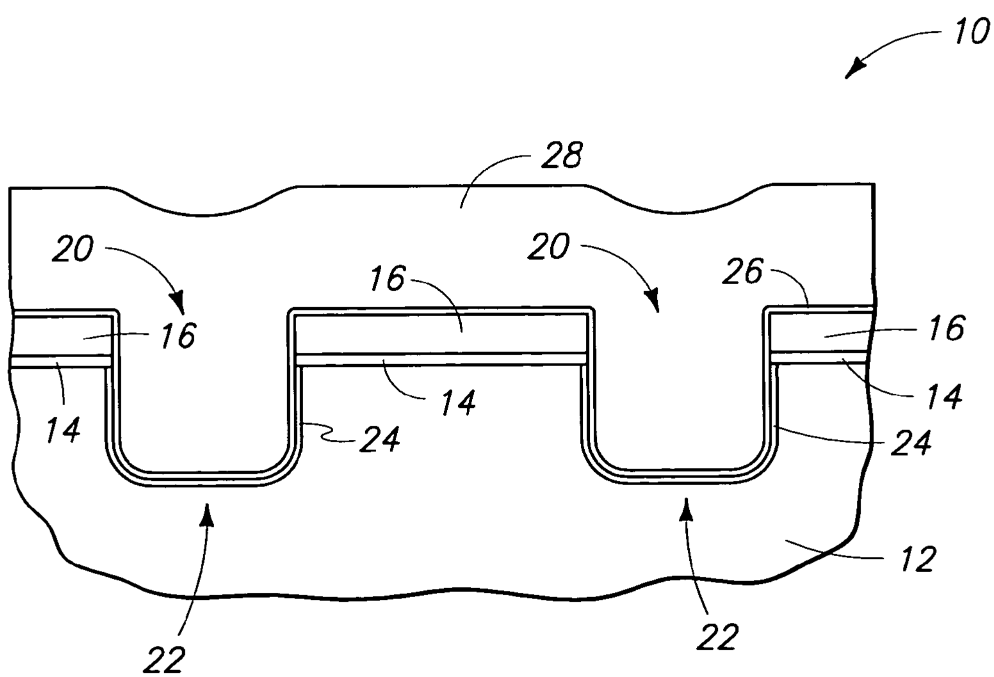
FIG. 5 is a view of the FIG. 4 wafer fragment at a processing step subsequent to that shown by FIG. 4.

Referring to FIG. 5, remaining volume of trenches 22 is filled with an isolation material 28. Exemplary materials include semiconductive materials (whether doped or undoped) and dielectric materials, for example (and preferably) silicon dioxide deposited using high density plasma.

Figure 6:
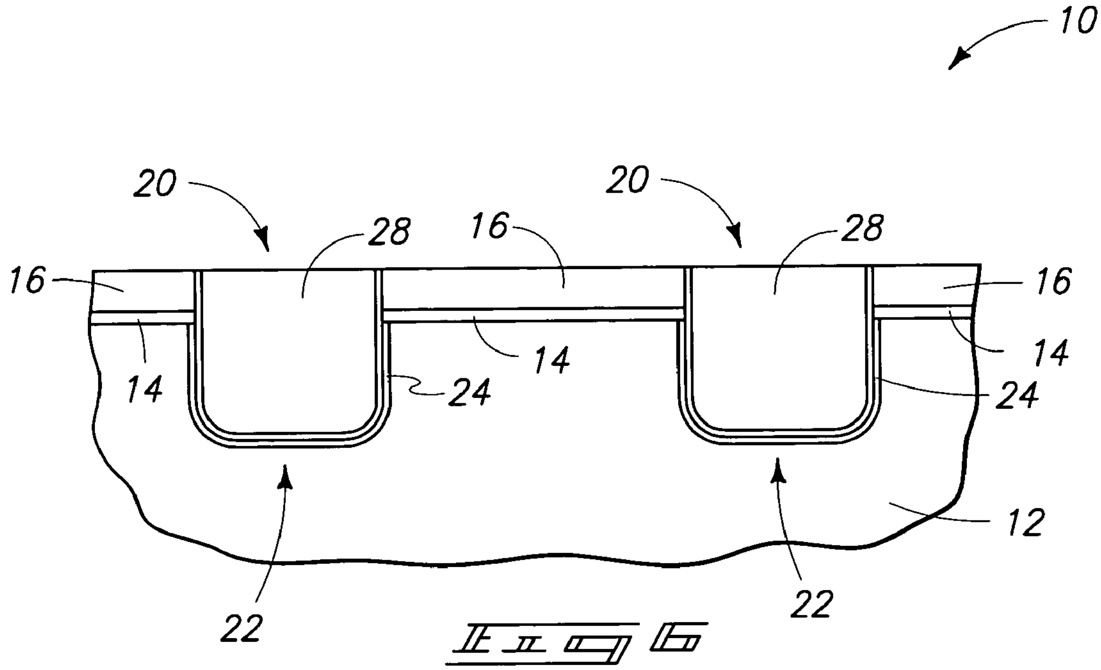
FIG. 6 is a view of the FIG. 5 wafer fragment at a processing step subsequent to that shown by FIG. 5.

Referring to FIG. 6, isolation material 28 has been removed by planarizing back effective to expose silicon nitride comprising mask 16, for example by chemical mechanical polishing.

The above provides but one exemplary manner of providing a substrate comprising silicon nitride and an oxide of aluminum. Any manner of so providing as just so literally stated, whether existing or yet-to-be developed, is contemplated in one exemplary embodiment; and as shown and described in the above preferred embodiment, the substrate comprises both an oxide of silicon and an oxide of aluminum.

Figure 7:
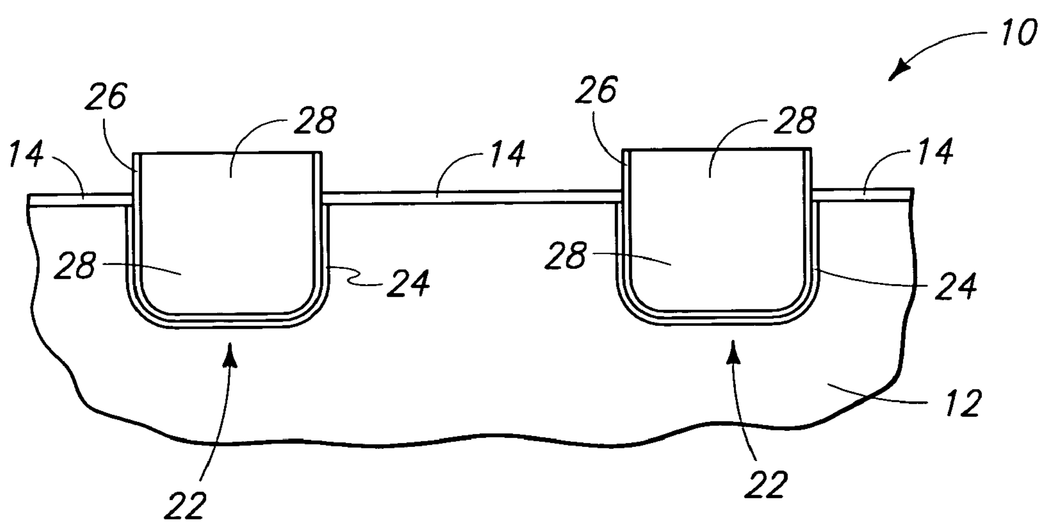
FIG. 7 is a view of the FIG. 6 wafer fragment at a processing step subsequent to that shown by FIG. 6.

Referring to FIG. 7, silicon nitride 16 (not shown) has been exposed to an etching solution comprising HF and an organic HF solvent under conditions effective to etch the silicon nitride comprising mask substantially selectively relative to aluminum oxide 26 and relative to isolation material 28. In the context of this document, a substantially selective etch is one which removes the primary silicon nitride material at a rate of at least 2:1 compared to the isolation material or oxide. An exemplary preferred organic HF solvent comprises an alcohol (of course including multiple alcohols). In one exemplary embodiment, the alcohol can be aliphatic. In one exemplary embodiment, the alcohol can be at least one selected from the group consisting of alicyclic, aromatic, and heterocyclic. One exemplary organic HF solvent comprises ethanol.

Further, exemplary preferred organic HF solvents include polyols, for example and preferably etching solutions having one or more polyols such that the boiling point of the etching solution is at least 150° C. Exemplary polyols include glycols and glycerols. More specific examples include propylene glycol and ethylene glycol. Additional preferred organic HF solvents include carboxylic acid polyols, for example glyceric acid (2,3-dihydroxypropanoic acid); 2,3-dihydroxybutanoic acid; 3,4-dihydroxy-butanoic acid.

In one preferred implementation, the etching solution comprises from 0.1% to 50% by weight water, more preferably from 0.1% to 15% by weight water, even more preferably from 0.1% to 5% by weight water, and still more preferably has from 0.1% to 1% by weight water. In one even more preferred implementation, the etching solution has from 0% to less than 0.1% by weight water.

The preferred quantity of HF in the etching solution is from 0.01% to 50% be weight, more preferably from 0.1% to 15% be weight, and even more preferably from 1% to 5% by weight.

In one preferred implementation, the etching solution consists essentially of HF, one or more organic HF solvents, and water, for example in any of the above preferred quantities. In one preferred implementation, the etching solution consists essentially of HF and organic HF solvent (meaning one or more HF solvents).

The exposing conditions preferably comprise a temperature of at least 60° C., with a range of from 70° C. to 90° C. being a specific preferred example, although temperatures in excess of 100° C. are also contemplated. The invention was reduced to practice at a temperature of 85° C. to 87° C. Any pressure is contemplated, with ambient room pressure being a specific and reduction-to-practice example.

An exemplary preferred and reduction-to-practice example constituted an etching solution consisting essentially of propylene glycol, HF and water. A propylene glycol solution was combined with an HF solution. The propylene glycol was 99.8% by weight, with the remaining 0.2% being water. The HF solution was 49% by weight HF, with the remaining 51% being water. Four percent (4.0%) to about 7.0% by weight of the HF solution was provided relative to a mixture of such propylene glycol and HF thereby providing approximately 2.0% to 3.5% by weight HF and approximately 2.0% to 3.5% by weight $H_2O$, with the remainder being propylene glycol and such minor amount of water included therewith. Etching conditions included ambient pressure and a temperature of about 86° C. Such resulted in selective etch rates of silicon nitride relative to densified aluminum oxide of about 5:1 to 7.5:1, and only slightly less in selectivity of etching silicon nitride relative to silicon dioxide (about 2:1). High water contents and lower temperatures had a tendency to reduce selectivity relative to silicon dioxide more so as compared to selectivity relative to aluminum oxide.

HF might be provided in the etching solution, for example as described above. Alternately by way of example only, 100% HF might be bubbled into an organic HF solvent solution towards minimizing water content in the etching solution. Alternately by way of example only, a manner of providing HF in an etching solution would be by the combining of an organic HF solvent with a solution comprising a mixture of $NH_4F$ and HCl.

The above exemplary preferred embodiments are believed, by way of example only, to suppress the dissociation constant of HF in an organic based solvent and the etch of silicon nitride by HF molecules at elevated temperature. Etch of aluminum oxide would likely progress faster with free fluoride ions—that are formed in the presence of water—, therefore a silicon nitride to aluminum oxide selective etch preferable minimizes water content of the solution. Organic HF solvents of ethylene glycol, propylene glycol and/or glycerol are believed to be most preferred to establish both such goals. Aluminum oxide etch rate and silicon nitride etch rate can be adjusted and selectively altered, as will be recognized by the artisan, by appropriate selection of HF content, process temperature and water content in the etching solution to satisfy specific application goals.

Although the invention was described and motivated as above with respect to trench isolation fabrication, the invention is in no way so limited. The invention contemplates any method of etching silicon nitride substantially selectively relative to an oxide of aluminum, whereby a substrate comprising silicon nitride and an oxide of aluminum is provided. The silicon nitride and the oxide on such substrate are exposed (whether initially exposed simultaneously, separately, and by any manner whether existing or yet-to-be developed) to an etching solution comprising HF and an organic HF solvent under conditions effective to etch the silicon nitride substantially selectively relative to such oxide. Regardless, preferred operating conditions in such context are otherwise as described above in the etching with respect to the above exemplary trench isolation method.

In compliance with the statute, the invention has been described in language more or less specific as to structural and methodical features. It is to be understood, however, that the invention is not limited to the specific features shown and described, since the means wherein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A method of etching silicon nitride substantially selectively relative to an oxide of aluminum, comprising:

providing a substrate comprising silicon nitride and an oxide of aluminum; and exposing the silicon nitride and the oxide to an etching solution comprising HF and an organic HF solvent under conditions effective to etch the silicon nitride substantially selectively relative to the oxide.

2. The method of claim 1 comprising providing the substrate to comprise an oxide of silicon and an oxide of aluminum, with the exposing being effective to etch the silicon nitride substantially selectively relative to each of said oxides.

3. The method of claim 1 wherein the etching solution comprises from 0.1% to 50% by weight water.

4. The method of claim 1 wherein the etching solution comprises from 0.1% to 15% by weight water.

5. The method of claim 1 wherein the etching solution comprises from 0.1% to 5% by weight water.

6. The method of claim 1 wherein the etching solution comprises from 0.1% to 1.0% by weight water.

7. The method of claim 1 wherein the etching solution has from 0% to less than 0.1% by weight water.

8. The method of claim 1 wherein the etching solution comprises from 0.01% to 50% by weight HF.

9. The method of claim 1 wherein the etching solution comprises from 0.1% to 15% by weight HF.

10. The method of claim 1 wherein the etching solution comprises from 1% to 5% by weight HF.

11. The method of claim 1 wherein the etching solution consists essentially of from 0.01% to 50% by weight HF, organic HF solvent, and from 0.1% to 50% by weight water.

12. The method of claim 1 wherein the etching solution consists essentially of from 0.1% to 15% by weight HF, organic HF solvent, and from 0.1% to 10% by weight water.

13. The method of claim 1 wherein the etching solution consists essentially of HF and organic HF solvent.

14. The method of claim 1 wherein the conditions comprise a temperature of at least 60° C.

15. The method of claim 1 wherein the conditions comprise a temperature of from 70° C. to 90° C.

16. The method of claim 1 wherein the etching solution comprises 0% by weight water.

17. The method of claim 1 wherein the organic HF solvent comprises an alcohol.

18. The method of claim 17 wherein the alcohol is aliphatic.

19. The method of claim 17 wherein the alcohol is alicyclic.

20. The method of claim 17 wherein the organic HF solvent comprises ethanol.

21. The method of claim 17 wherein the alcohol is aromatic.

22. The method of claim 17 wherein the alcohol is heterocyclic.

23. The method of claim 1 wherein the organic HF solvent comprises a polyol.

24. The method of claim 23 wherein the polyol has a boiling point of at least 150° C.

25. The method of claim 23 wherein the polyol comprises a glycol.

26. The method of claim 23 wherein the polyol comprises a glycerol.

27. The method of claim 23 wherein the polyol comprises a carboxylic acid.

28. A method of etching silicon nitride substantially selectively relative to aluminum oxide, comprising:

providing a substrate comprising silicon nitride and a densified aluminum oxide; and exposing the silicon nitride and the densified aluminum oxide to an etching solution comprising HF and an organic HF solvent under conditions effective to etch the silicon nitride substantially selectively relative to the densified aluminum oxide.

29. The method of claim 28 wherein the etching solution comprises from 0.1% to 50% by weight water.

30. The method of claim 28 wherein the etching solution comprises from 0.1% to 15% by weight water.

31. The method of claim 28 wherein the etching solution comprises from 0.1% to 5% by weight water.

32. The method of claim 28 wherein the etching solution comprises no more than 1% by weight water.

33. The method of claim 28 wherein the etching solution has from 0% to less than 0.1% by weight water.

34. The method of claim 28 wherein the etching solution comprises from 0.01% to 50% by weight HF.

35. The method of claim 28 wherein the etching solution comprises from 0.1% to 15% by weight HF.

36. The method of claim 28 wherein the etching solution comprises from 1% to 5% by weight HF.

37. The method of claim 28 wherein the etching solution consists essentially of from 0.01% to 50% by weight HF, organic HF solvent, and from 0.1% to 50% by weight water.

38. The method of claim 28 wherein the etching solution consists essentially of from 0.1% to 15% by weight HF, organic HF solvent, and from 0.1% to 10% by weight water.

39. The method of claim 28 wherein the etching solution consists essentially of HF and organic HF solvent.

40. The method of claim 28 wherein the conditions comprise a temperature of at least 60° C.

41. The method of claim 28 wherein the conditions comprise a temperature of from 70° C. to 90° C.

42. The method of claim 28 wherein the etching solution comprises 0% by weight water.

43. The method of claim 28 wherein the organic HF solvent comprises an alcohol.

44. The method of claim 43 wherein the alcohol is aliphatic.

45. The method of claim 43 wherein the alcohol is alicyclic.

46. The method of claim 43 wherein the organic HF solvent comprises ethanol.

47. The method of claim 43 wherein the alcohol is aromatic.

48. The method of claim 43 wherein the alcohol is heterocyclic.

49. The method of claim 28 wherein the organic HF solvent comprises a polyol.

50. The method of claim 49 wherein the polyol has a boiling point of at least 150° C.

51. The method of claim 49 wherein the polyol comprises a glycol.

52. The method of claim 49 wherein the polyol comprises a glycerol.

53. The method of claim 49 wherein the polyol comprises a carboxylic acid.

* * * * *

UNITED STATES PATENT AND TRADEMARK OFFICE

CERTIFICATE OF CORRECTION

PATENT NO. : 7,030,034 B2
APPLICATION NO. : 10/664738
DATED : April 18, 2006
INVENTOR(S) : Fucsko et al.

It is certified that error appears in the above-identified patent and that said Letters Patent is hereby corrected as shown below:

Col. 5, line 24 –
Replace “selective etch preferable minimizes water content of the”
Insert --selective etch preferably minimizes water content of the--

Col. 5, line 52 –
Replace “and described, since the means wherein disclosed comprise”
Insert --and described, since the means herein disclosed comprise--

Signed and Sealed this

Sixth Day of March, 2007

JON W. DUDAS
*Director of the United States Patent and Trademark Office*